(12) United States Patent
Zaidi

(10) Patent No.: US 6,914,545 B1
(45) Date of Patent: Jul. 5, 2005

(54) CIRCUITRY AND METHODS FOR REDUCING RUN-LENGTH OF ENCODED DATA

(75) Inventor: Iqbal Hussain Zaidi, Poughkeepsie, NY (US)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/965,454

(22) Filed: Oct. 13, 2004

(51) Int. Cl.[7] .............................................. H03M 7/00
(52) U.S. Cl. ......................... 341/59; 341/58; 341/94; 341/95
(58) Field of Search ...................... 341/58–59, 94–95, 341/102

(56) References Cited

U.S. PATENT DOCUMENTS

| | | | |
|---|---|---|---|
| 4,486,739 A | | 12/1984 | Franaszek et al. |
| 4,499,454 A | * | 2/1985 | Shimada ..................... 341/58 |
| 4,626,826 A | * | 12/1986 | Fukuda et al. ............... 341/58 |
| 4,855,742 A | * | 8/1989 | Verboom ..................... 341/102 |
| 5,025,256 A | * | 6/1991 | Stevens ....................... 341/59 |
| 5,245,339 A | | 9/1993 | Cideciyan |
| 5,699,062 A | * | 12/1997 | Widmer ....................... 341/58 |
| 5,748,119 A | * | 5/1998 | Ko .............................. 341/59 |
| 6,295,010 B1 | * | 9/2001 | Thiesfeld .................... 341/58 |
| 6,323,789 B1 | | 11/2001 | Lawrence |
| 6,333,704 B1 | * | 12/2001 | Jung et al. ................... 341/58 |
| 6,501,396 B1 | | 12/2002 | Kryzak et al. |
| 6,614,369 B1 | | 9/2003 | Widmer |
| 6,617,984 B1 | | 9/2003 | Kryzak et al. |
| 6,642,862 B2 | * | 11/2003 | Boudry ........................ 341/58 |
| 6,700,510 B1 | | 3/2004 | Kryzak et al. |

OTHER PUBLICATIONS

A.X. Widmer and P.A. Franaszek, "A DC–Balanced, Partitioned–Block, 8B/10B Transmission Code", *IBM J. Res. Develop.*, vol. 27, No. 5, Sep. 1983, pp. 440–451.

* cited by examiner

*Primary Examiner*—Peguy JeanPierre
*Assistant Examiner*—Khai Nguyen

(57) ABSTRACT

An encoder for enabling selection of output bits that reduce run-length includes classification circuitry, a disparity control circuit, encoding circuitry, and a run-length control circuit. The classification circuitry is configured to receive data in a first bitwidth. An output of the classification circuitry is in communication with the disparity control circuit. The encoding circuitry is configured to encode the data received in the first bitwidth into a second bitwidth. The run-length control circuit is included in the encoding circuit and is selectively triggered in one coding scheme when a contiguous portion of the data of the first bitwidth is of a particular sequence, e.g., all logic ones, to generate a control signal. The run-length control circuit receives as additional inputs outputs of a portion of the encoding circuitry and a disparity signal from the current encoding cycle. The control signal, when generated, reduces run-length of the second bitwidth.

14 Claims, 7 Drawing Sheets

TABLE 3  5B/6B ENCODING

| NAME | ABCDEK | | CLASSIFICATIONS | | D-1 | abcdei | D0 | abcdei |
|---|---|---|---|---|---|---|---|---|
| | | | BIT ENCODING | DISPARITY | | | | ALTERNATE |
| D.0 | 00000 | 0 | L04 | L22'*L31'*E' | + | 011000 | − | 100111 |
| D.1 | 10000 | 0 | L13*E' | L22'*L31'*E' | + | 100010 | − | 011101 |
| D.2 | 01000 | 0 | L13*E' | L22'*L31'*E' | + | 010010 | − | 101101 |
| D.3 | 11000 | 0 | L22*E' | | x | 110001 | 0 | |
| D.4 | 00100 | 0 | L13*E' | L22'*L31'*E' | + | 001010 | − | 110101 |
| D.5 | 10100 | 0 | L22*E' | | x | 101001 | 0 | |
| D.6 | 01100 | 0 | L22*E' | | x | 011001 | 0 | |
| D.7 | 11100 | 0 | | L31*D'*E' | − | 111000 | 0 | 000111 |
| D.8 | 00010 | 0 | L13*E' | L22'*L31'*E' | + | 000110 | − | 111001 |
| D.9 | 10010 | 0 | L22*E' | | x | 100101 | 0 | |
| D.10 | 01010 | 0 | L22*E' | | x | 010101 | 0 | |
| D.11 | 11010 | 0 | | | x | 110100 | 0 | |
| D.12 | 00110 | 0 | L22*E' | | x | 001101 | 0 | |
| D.13 | 10110 | 0 | | | x | 101100 | 0 | |
| D.14 | 01110 | 0 | | | x | 011100 | 0 | |
| D.15 | 11110 | 0 | L40 | L22'*L31'*E' | + | 101000 | − | 010111 |
| D.16 | 00001 | 0 | L04, L04*E | L22'*L31'*E | − | 011011 | + | 100100 |
| D.17 | 10001 | 0 | L13*D'*E | | x | 100011 | 0 | |
| D.18 | 01001 | 0 | L13*D'*E | | x | 010011 | 0 | |
| D.19 | 11001 | 0 | | | x | 110010 | 0 | |
| D.20 | 00101 | 0 | L13*D'*E | | x | 001011 | 0 | |
| D.21 | 10101 | 0 | | | x | 101010 | 0 | |
| D.22 | 01101 | 0 | | | x | 011010 | 0 | |
| D/K.23 | 11101 | x | | L22'*L31'*E | − | 111010 | + | 000101 |
| D.24 | 00011 | 0 | L13*D*E | L13*D*E | + | 001100 | − | 110011 |
| D.25 | 10011 | 0 | | | x | 100110 | 0 | |
| D.26 | 01011 | 0 | | | x | 010110 | 0 | |
| D/K.27 | 11011 | x | | L22'*L31'*E | − | 110110 | + | 001001 |
| D.28 | 00111 | 0 | | | x | 001110 | 0 | |
| → K.28 | 00111 | 1 | L22*K | K | − | 001111 | + | 110000 |
| D/K.29 | 10111 | x | | L22'*L31'*E | − | 101110 | + | 010001 |
| D/K.30 | 01111 | x | | L22'*L31'*E | − | 011110 | + | 100001 |
| D.31 | 11111 | 0 | L40, L40*E | L22'*L31'*E | − | 101011 | + | 010100 |

FIG. 2

3B/4B ENCODING

| NAME | FGH | K | CLASSIFICATIONS | | D-1 | fghj | D0 | fghj |
|---|---|---|---|---|---|---|---|---|
| | | | BIT ENCODING | DISPARITY | | | | ALTERNATE |
| D/K.x.0 | 000 | x | F'*G'*H' | F'*G' | + | 0100 | − | 1011 |
| D.x.1 | 100 | 0 | (F≠G)*H' | | x | 1001 | 0 | |
| D.x.2 | 010 | 0 | (F≠G)*H' | | x | 0101 | 0 | |
| D/K.x.3 | 110 | x | | F*G | − | 1100 | 0 | 0011 |
| D/K.x.4 | 001 | x | | F'*G' | + | 0010 | − | 1101 |
| D.x.5 | 101 | 0 | | | x | 1010 | 0 | |
| D.x.6 | 011 | 0 | | | x | 0110 | 0 | |
| ⟶ D.x.P7 | 111 | 0 | | F*G,F*G*H | − | 1110 | + | 0001 |
| ⟵ D/K.y.A7 | 111 | x | F*G*H*(S+K) | F*G,F*G*H | − | 0111 | + | 1000 |
| K.28.1 | 100 | 1 | (F≠G)*H' | (F≠G)*K | + | 1001 | 0 | 0110 |
| K.28.2 | 010 | 1 | (F≠G)*H' | (F≠G)*K | + | 0101 | 0 | 1010 |
| K.28.5 | 101 | 1 | | (F≠G)*K | + | 1010 | 0 | 0101 |
| K.28.6 | 011 | 1 | | (F≠G)*K | + | 0110 | 0 | 1001 |

FIG. 3

CIRCUITRY AND METHODS FOR REDUCING RUN-LENGTH OF ENCODED DATA

BACKGROUND OF THE INVENTION

1. Field of the Invention

This invention relates generally to methods and structures for improving byte-oriented encoding, and more particularly to methods and structures that enable improvements in the reduction of encoded data run-length in high speed encoding.

2. Description of the Related Art

In the design and fabrication of DC-balanced, partitioned-block, high-speed, 8B/10B encoders, it is well known that an encoded binary signal string with a long run-length, e.g., greater than five, destabilizes clock data recovery logic and produces unreliable clock data recovery in a high speed data communication application, such as a peripheral component interconnect express card. FIG. 1 shows a typical layout of a peripheral component interconnect express (PCIExpress) card 100 and illustrates how an 8B/10B encoder 106 may be used in conjunction with some other components on the PCIExpress card 100, such as a serializer 108 and a clock data recovery (CDR) unit 110. The PCIExpress card 100 is typically characterized by two blocks of circuitry; for example, a transmission block circuitry 102 and a reception block circuitry 104. The 8B/10B encoder 106 and the serializer 108 are considered to be transmission components and they are included in the transmission block circuitry 102. Whereas, the clock data recovery unit 110 is considered to be a reception component, and it is included in the reception block circuitry 104. A paper written by A. X. Windmer and P. A. Franaszek, A DC-Balanced, Partitioned-Block, 8B/10B Transmission Code, describes a typical 8B/10B encoder and provides a discussion on eight-bit to ten-bit encoding logic. This paper and the discussion provided therefrom are incorporated herein by reference.

Typically, an encoder receives an input data string from an input line or data bus. The input data string comprises a string of bits identified, for example, by ABCDEFGH. To initiate encoding, the incoming bits of an input data string are partitioned into sub-strings, ABCDE and FGH, and classified. The five bits of classified sub-string ABCDE are encoded into six bits, abcdei, in accordance with 5B/6B encoding functions and disparity control, and the three bits of classified sub-string FGH are encoded into four bits, fghj, in accordance with 3B/4B encoding functions. Encoding tables are shown in FIGS. 2 and 3 illustrate typical 5B/6B and 3B/4B encoding functions, respectively, that are commonly performed in conventional encoders.

However, due to certain peculiarities in the coding functions of conventional encoders, they sometimes produce output data strings with a long run-length, e.g., greater than five. This destabilizes the clock data recovery logic and causes unreliable clock data recovery. A special character is used to execute bit encoding to avoid producing an output string with an undesirable run-length. However, in conventional encoders there is a delay in receiving the input signals that are used to determine the special character as a result of how such inputs are generated.

In low-speed applications, for example encoding processed at below 200 MHz, the delay from the conventional encoding logic circuitries have not caused any significant adverse effects on clock data recovery. However, for high-speed applications, for example, encoding processed at about 200 MHz and higher, the delay causes some encoding switches to select and process the wrong input. As a result, conventional encoders may produce output data strings having undesirable run-lengths, e.g., a run-length greater than five.

Accordingly, conventional encoders are not well suited for high-speed encoding. What is needed is an encoder that is capable of reliably and consistently producing output data strings with shorter run-lengths.

SUMMARY OF THE INVENTION

The present invention provides the methods and structures that enable improvements in the reduction of encoded data run-length in high-speed encoding. Several inventive embodiments of the present invention are described below.

In one embodiment, an encoder for enabling selection of output bits that reduce run-length is provided. The encoder includes classification circuitry, a disparity control circuit, encoding circuitry, and a special character circuit. The classification circuitry is configured to receive data in a first bitwidth. An output of the classification circuitry is in communication with the disparity control circuit. The encoding circuitry is configured to encode the data received in the first bitwidth into a second bitwidth. The special character circuit is included in the encoding circuitry. The special character circuit is configured to receive as input signals selected output signals from the encoding circuitry and an output signal from the disparity circuit. The special character circuit is configured to output a special character signal to be used, along with a logical combination of selected input signals of the first bitwidth, as input signals to a run-length control circuit, which, when triggered, outputs a run-length control signal to reduce run-length of the second bitwidth.

Advantageously, the special character circuit does require any slow generating input signals. In one embodiment, the output signal from the disparity control circuit that is used as an input signal to the special character circuit is from the previous encoding cycle.

In one coding protocol, the run-length control circuit is triggered when the selected input signals of the first bitwidth comprise a predetermined sequence of contiguous data signals, e.g., three contiguous data signals of the same logic state, e.g., (111).

In another embodiment, a high-speed encoding system for accepting data in a first bitwidth and generating data in a second bitwidth is provided. The encoding system includes an input data bus, first and second classification circuits, a disparity control circuit, first and second output encoders, the latter of which includes a run-length control circuit, and an output data bus. The input data bus defines the first bitwidth. The first classification circuit receives a first portion of the bitwidth and produces a first bit signal and a first input data set. The second classification circuit receives a second portion of the first bitwidth and produces a second bit signal and a second input data set. The disparity control circuit receives the first and second bit signals and produces a plurality of disparity output signals.

The first output encoder receives the first input data set from the classification circuit and produces a first output data set.

The second output encoder includes a run-length control circuit configured to receive a disparity output signal from the disparity control circuit, a portion of the first output data set from the first output encoder, and a logical combination of the second input data set. The run-length control circuit is selectively triggered to output a run-length control signal based on the sequence of the second input data set, the second output encoder being configured to use the control signal, when the control circuit is triggered, to execute encoding to produce a second output data set, such that the run-length of the second bitwidth is reduced, and to execute encoding in accordance with normal encoding protocol when the control circuit is not triggered to produce the second output data set.

The output data bus combines the first output data set and the second output data set to form the second bitwidth.

In yet another embodiment, a method for encoding data received in a first bitwidth into data of a second bitwidth is provided. The method is initiated by receiving data in the first bitwidth. The received data is classified and disparity control is performed on the classified data. A first portion of the received data is encoded to produce a first output data set.

A special character function is executed during the encoding of a second portion of the received data, the execution of the special character function being performed using a portion of the first output data set and a disparity signal to generate a special character signal. The special character signal and a logical combination of the second portion of the received data are used to selectively generate a run-length control signal, which, when generated, is used to encode a second portion of the received data such that the run-length of the second bitwidth is reduced. The data in the second bitwidth is then outputted.

Advantageously, performance of the special character function does require any slow generating input signals. In one embodiment, the disparity signal is from the previous encoding cycle.

Other aspects and advantages of the invention will become apparent from the following detailed description, taken in conjunction with accompanying drawings, illustrating by way of examples the principles of the invention.

BRIEF DESCRIPTION OF THE DRAWINGS

The present invention will be readily understood by the following detailed description in conjunction with the accompanying drawings, and like reference numerals designating like structural elements.

FIG. 2 is a 5B/6B encoding table.

FIG. 3 is a 3B/4B encoding table.

DETAILED DESCRIPTION

The present invention, as illustrated by the following embodiments, provides methods and structures that enable reduction in run-length of an encoded binary output data string for DC-balanced, partitioned-block, high-speed 8B/10B encoding. In one example, an encoded binary output data string with a reduced run-length provides stable and reliable clock data recovery in a peripheral component interconnect express (PCIExpress) card. Further yet, the improvements provided by the embodiments of the present invention, such as eliminating certain disparity control delays, may be applied generally to enhance the speed and accuracy of encoding. As should be appreciated, the present invention can be implemented in numerous ways, including a method, system, or device. In some instances, well known process operations have not been described in detail in order to avoid obscuring the present invention.

FIG. 2 shows a 5B/6B encoding table illustrating the 5B/6B encoding functions that are executed for various five-bit inputs. The K.28 input character is highlighted since it is used to illustrate improvement of reducing the run-length of certain encoded binary output strings in accordance with one embodiment of the present invention.

FIG. 3 shows a 3B/4B encoding table illustrating the 3B/4B encoding functions that are executed for various three-bit inputs. The D.x.P7 and D/K.y.A7 characters are highlighted as these two input characters are used to illustrate the improvement of reducing the run-length of encoded binary output strings in accordance with one embodiment of the present invention.

Figure 1:
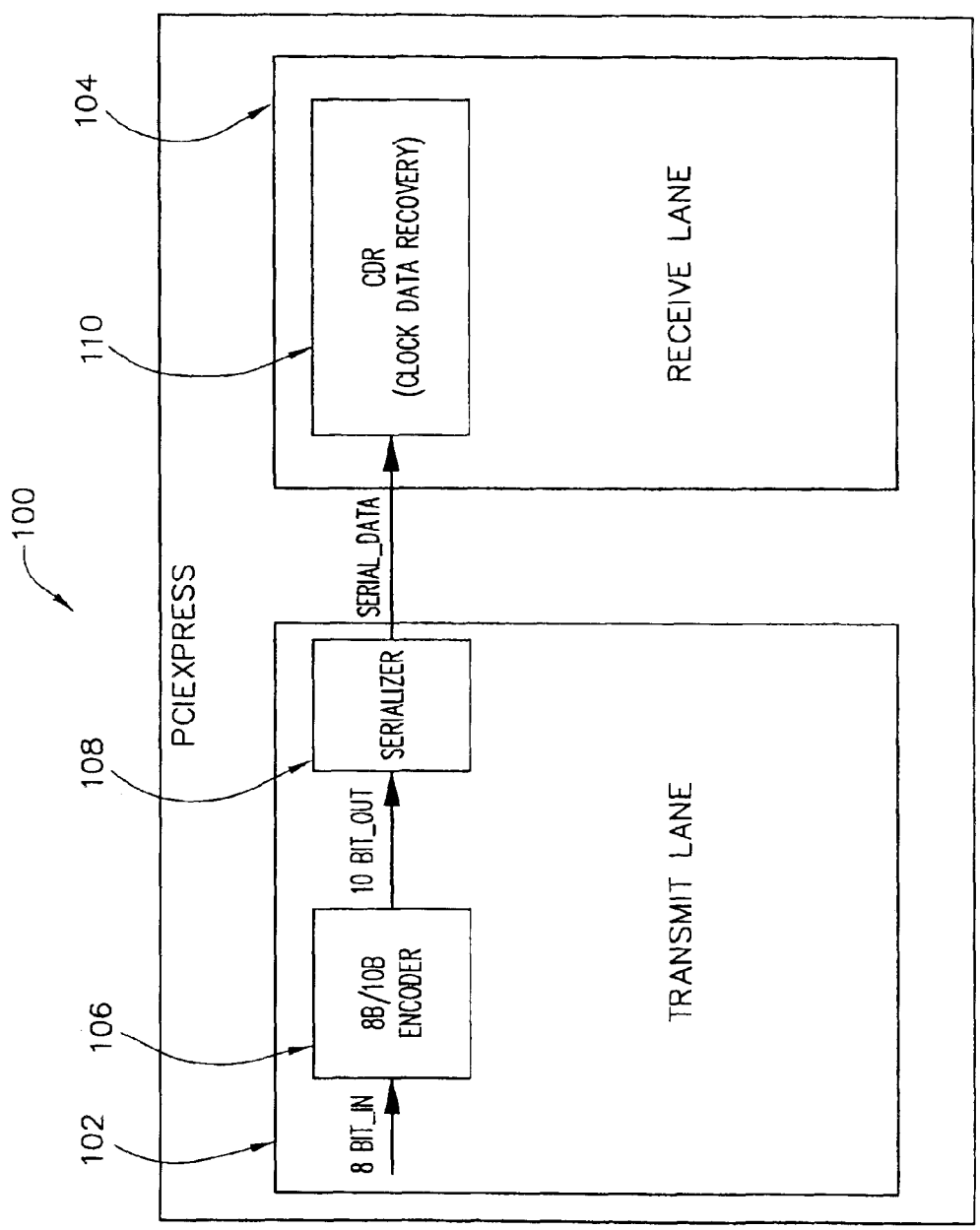
FIG. 1 is a block diagram of a peripheral component interconnect express (PCIExpress) card.
Figure 4A:
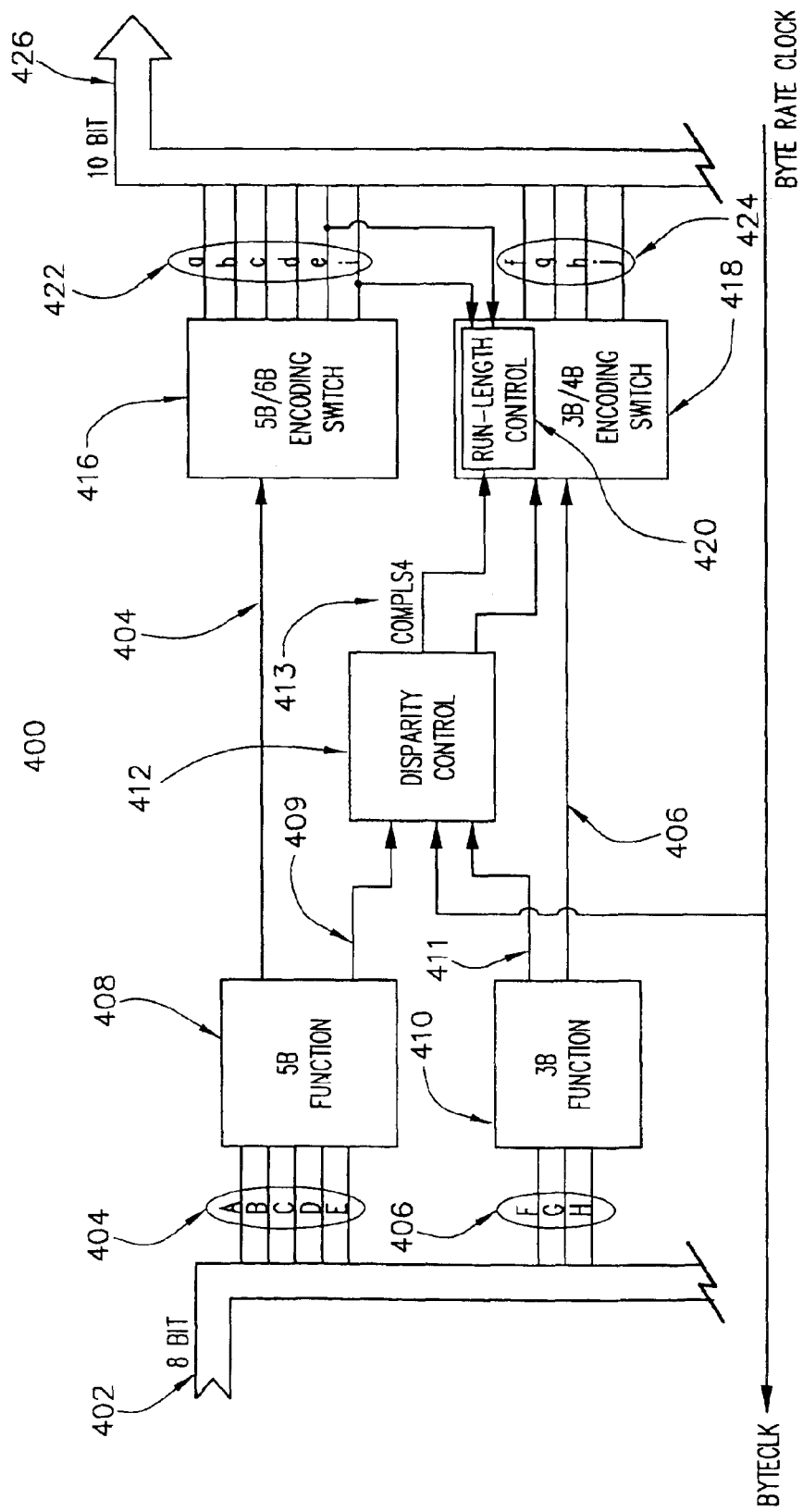
FIG. 4A is a block diagram of an 8B/10B encoder with an S-character circuit that is capable of improving the run-length of an encoded binary output data string, in accordance with one embodiment of the present invention.

FIG. 4A shows an 8B/10B binary encoder 400 with an Scharacter circuit 420 incorporated in a 3B/4B encoding switch 418 in accordance with one embodiment of the present invention. As shown in FIG. 4A, a five-bit functional block 408 and a three-bit functional block 410, respectively, receive a five-bit input data string, ABCDE, 404 and three-bit input data string, FGH, 406 from the eight-bit input data bus 402. The five-bit functional block 408 classifies each of the bits in five-bit input data string 404 as data or non-data and then produces a classified five-bit input data string 404 to a 5B/6B encoding switch 416 and a 6B control signal 409 to a disparity control block 412. The three-bit functional block 410 classifies each of the bits of the three-bit input data 406 as data or non-data and then produces a classified three-bit input data string 406 to a 3B/4B encoding switch 418 and a 4B control signal 411 to the disparity block 412. The 5B/6B encoding switch 416 executes an encoding function in accordance with the encoding rules in a 5B/6B encoding table shown in FIG. 2, and produces a six-bit output data string, abcdei, 422. The 3B/4B encoding switch 418 executes an encoding function in accordance with the encoding rules in a 3B/4B encoding table shown in FIG. 3, and produces a four-bit output data string, fghj, 424.

However, when a run-length control circuit 420 is triggered, i.e., it outputs a run-length control signal to reduce the run-length in the combined output string abcdeifghj, which would otherwise suffer from a run-length problem if the 3B/4B encoding switch 418 were to encode as normal. Whether or not the run-length control circuit 420 is triggered to generate a run-length control signal depends on the values of the input signals to the run-length control circuit 420. Those inputs include a logical combination of selected input signals of the input data string, selected output signals from the output data string, a disparity output signal 413 and an S_NEW signal. In one embodiment, the disparity signal 413 is the signal COMPLS4 described in the paper identified above and incorporated by reference herein. The generation of the S_NEW signal and the run-length control signal (RUN-LENGTH CONTROL) is described in more detail below in connection with FIG. 5. In one embodiment, the run-length control circuit 420 processes a logical combination of signals F, G and H, output signals e and i, and the disparity control signal 413. In one embodiment, the run-length control circuit 420 is configured to be triggered when the three-bit input data string, FGH, is defined by a particular sequence of data signals, e.g., all of the same logic state, e.g., all logic ones (111). By executing the 3B/4B function in accordance with the run-length control signal, the combined output data string is reduced.

In one situation, the combined run-length of the six-bit output data string 422 and the four-bit output data string 424 is reduced at the ten-bit output bus 426 from seven to four. This situation can be illustrated using input characters K.28, D.x.P7 and D/K.y.A7. As can be seen from FIGS. 2 and 3, when the abcdei output string for input character K.28 (001111 or 110000) is combined with the fghj output string for input character D.x.P7 (1110 or 0001), the combined output string abcdeifghj (0011111110 or 1100000001) has a run-length of seven. This problem arises from the fact that, as can be seen from FIG. 3, the input bit string FGH is the same for both input characters D.x.P7 and D/K.y.A7, i.e., 111, and that in conventional encoders there is a delay in receiving the input signals that are used to determine the special character (S-character) as a result of how such inputs are generated. In high-speed applications, e.g., encoding processed at about 200 MHz and higher, when the output strings for characters K.28 and D/k-y.A7 are to be combined, this delay causes a conventional encoder to select the output string for the character D.x.P7 to combine with the output string for the character K.28 causing a run-length problem.

The inventor's ran-length control circuit 420 solves this type of problem. The input signals to control circuit 420 result in much less delay in generating the S_NEW signal and the run-length control signal (RUN-LENGTH CONTROL), which is selectively generated based on the S_NEW signal and a logical combination of selected inputs from the input data string. The delay is reduced in some cases by 400–500 pico seconds. The run-length control signal, when generated, is used to limit the run-length of the combined output string. With the reduced delay, the run-length of a combined output string can be maintained at a sufficiently low number to avoid clock data recovery problems, even in high-speed encoding applications. For example, the run-length problem discussed above is avoided, because of the reduced delay in generation of S_NEW. In this example, the run-length control circuit 420 is triggered because the three-bit input data string FGH is defined by all logic ones. Thus, in this example, according to the encoding tables, the combined ten-bit output data string, abcdeifghj, is defined by 0011110111 and 1100001000.

Still referring to FIG. 4A, the run-length control circuit 420 is incorporated in the 3B/4B encoding switch 418 and uses the disparity output signal 413 from the previous cycle which is readily available, but advantageously does not require as input signals any other disparity output signals. In contrast, conventional 8B/10B encoders incorporate an S-character circuit in the 3B functional block and require disparity output signals, e.g., NDL6 and PDL4, that require at least four delays and one loop in the disparity logic circuitry to produce. This, in turn, causes a delay in producing and presenting the S-character for 3B/4B encoding in conventional encoders. Because of the delay in presenting the S-character, the conventional 3B/4B encoding switch selects an undesirable encoding input, such as D.x.P7. Upon executing the encoding functions, the conventional encoder produces a ten-bit data string with an undesirable run-length, e.g., a run-length greater than five, which causes unreliable clock data recovery.

Figure 4B:
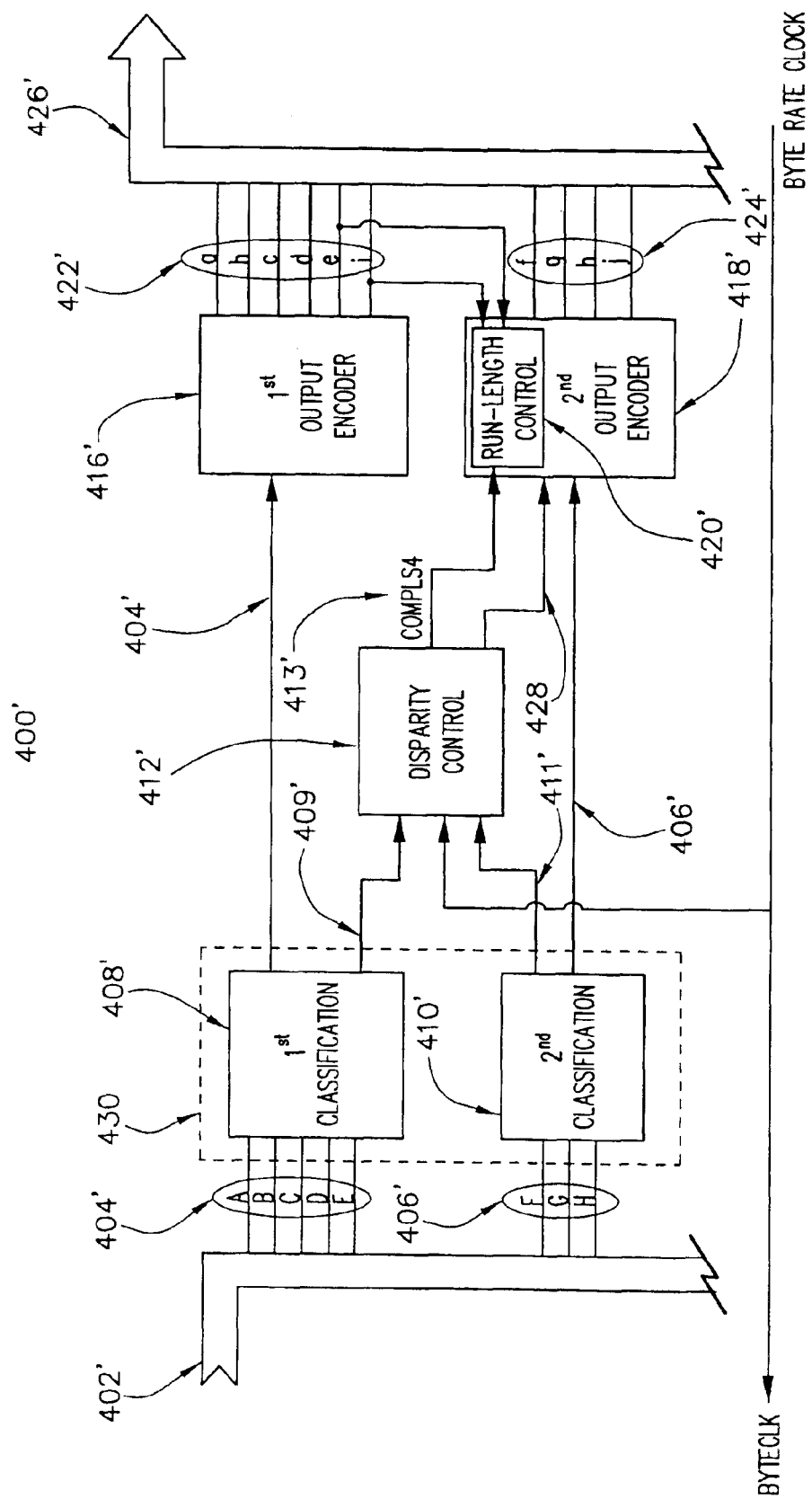
FIG. 4B is a block diagram of a generic encoder with an S-character circuit that is capable of improving the run-length of an encoded binary output data string, in accordance with one embodiment of the present invention.

FIG. 4B shows a generic encoding circuit 400' with an S-character circuit 420' incorporated in a second output encoder 418'. A classification circuitry 430 contains a first classification circuit 408' and a second classification circuit 410'. An input data bus 402' provides data in a first bitwidth. The first classification circuit 408' receives a first input data set 404' from a portion of the first bitwidth. The second classification circuit 410' receives a second input data set 406' from another portion of the first bitwidth. The first classification circuit 408' produces a first bit signal 409' and a first classified data set 404'. The second classification circuit 410' produces a second bit signal 411' and a second classified input data set 406'. A first output encoder 416' receives the first classified input data set 404' and produces a first output data set 422'. A disparity control 412' receives the first bit signal 409' and the second bit signal 411', and produces a plurality of disparity output signals 413' and 428. A second output encoder 418' receives one of the disparity outputs 428 and the second classified input data set 404' and produces a second output data set 424'. However, when the run-length control circuit 420' is triggered, e.g., when the second classified input data set 404' is all logic ones, control circuit 420' generates a run-length control signal. In response to the run-length control signal, the second output encoder 418' executes bit encoding such that the combined output string at bus 426', i.e., the first output data set 422' combined with the second output data set 424' has a reduced run-length, e.g., a run-length less than five.

Figure 5:
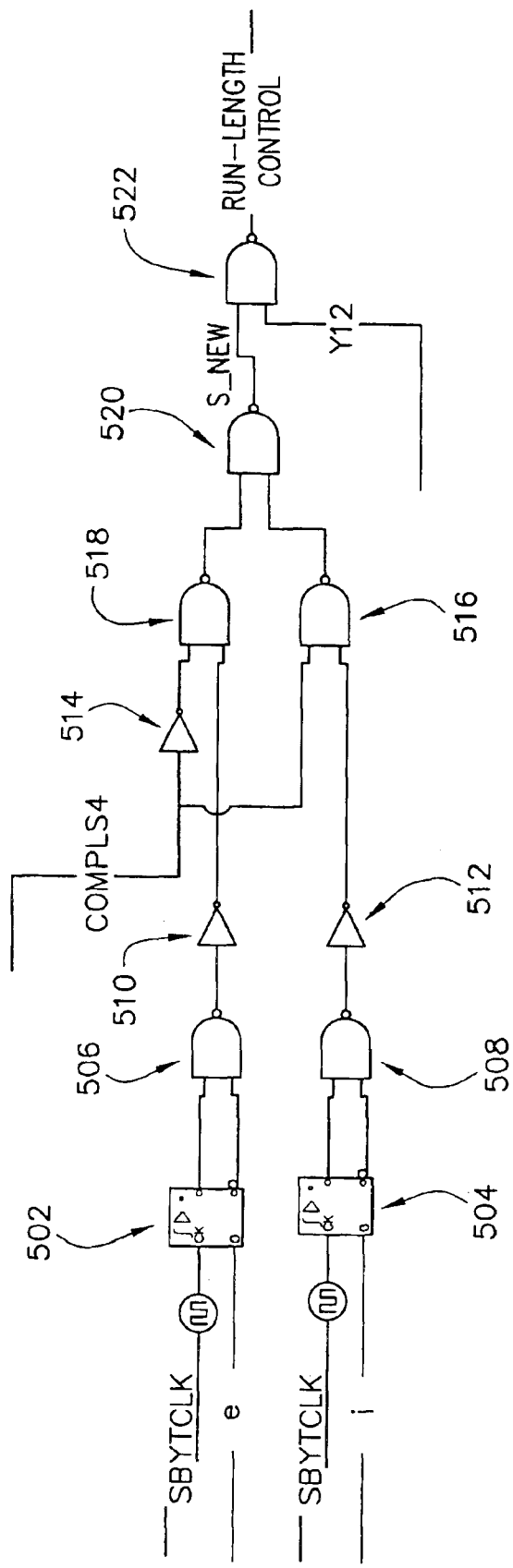
FIG. 5 is a block diagram illustrating the logic circuitry of an S-character circuit, in accordance with one embodiment of the present invention.

FIG. 5 shows a logic diagram of the circuitry 500 that may be used to implement run-length control circuit 420 and/or 420' in accordance with embodiments of the present invention. Flip-flop 502 receives a system clock signal and a portion of the first output data set 422', e.g., signal e. Signal e is selected in the illustrated embodiment because it is last data bit in the output string abcde that corresponds to input ABCDE and thus contains collective information regarding output string abcde. NAND gate 506 receives two output signals from flip-flop 502. Inverter 510 receives an output signal from NAND gate 506. Inverter 514 receives a disparity output signal, e.g., COMPLS4. NAND gate 518 received an output signal from each of Inverter 514 and Inverter 510. Flip-flop 504 receives a system clock signal and a portion of the first output data set 422', e.g., signal i, which is the new bit generated in the output string abcdei. NAND gate 508 receives two output signals from flip-flop 504. Inverter 512 receives an output signal from NAND gate 508. NAND gate 516 receives a disparity output signal, e.g., COMPLS4, and an output signal from Inverter 512. NAND gate 520 receives an output signal from each of NAND gate 518 and NAND gate 516 to generate S_NEW. NAND gate 522 receives S_NEW and a logical combination of a portion of the input data string. The run-length control signal (RUN-LENGTH CONTROL) is used by the 3B/4B encoding switch 418 and/or the second output encoder 418' to reduce the run-length in executing bit encoding.

In one embodiment, the logical combination of FGH is F AND G AND H, wherein an FGH combination of 111 triggers the run-length control circuitry 500 to generate the run-length control signal (RUN-LENGTH CONTROL). This is just one example (e.g., for the specific problem described above) of an FGH combination that triggers the circuitry 500 to issue a run-length control signal used by the. encoding switch 418/output encoder 418' to reduce run-length of the combined output string.

Figure 6:
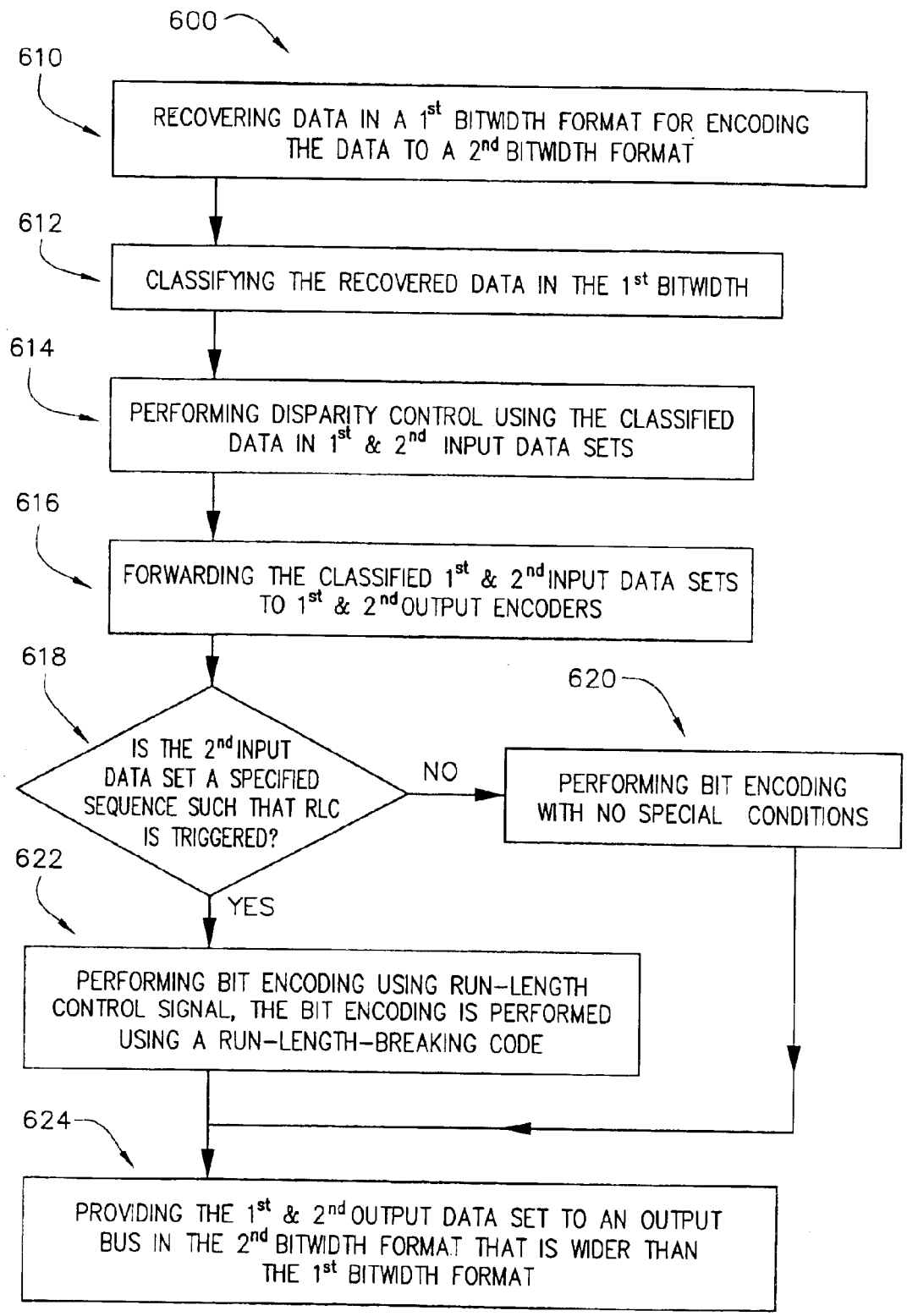
FIG. 6 is a flow chart diagram illustrating the logic for executing the encoding method in a generic encoder that is capable of improving the run-length of an encoded binary output data string, in accordance with one embodiment of the present invention.

FIG. 6 is a logic flow chart 600 illustrating a method of executing bit encoding in accordance with one embodiment of the present invention. In functional block 610, data is recovered in a first bitwidth format for encoding to a second bitwidth format. In functional block 612, data in the first bitwidth is classified to produce a first input data set and a second input data set. In functional block 614, disparity control is performed using the first and second input data sets. In functional block 616, the first and second input data sets are respectively forwarded to a first output encoder and a second output encoder. In logic block 618, it is determined if the run-length control (RLC) circuit has been triggered. For example, in one embodiment, if the second input data set is defined by data signals of a predetermined sequence, e.g., data signals of the same logic state, e.g., all logic ones (111), the run-length control circuit is triggered to generate a run-length control signal.

In functional block 620, when the run-length control circuit is not triggered, bit encoding is performed on the classified first and second input data sets with no special conditions. In functional block 622, when the run-length control circuit is triggered, it is used to perform encoding using a run-length-breaking code. The run-length control circuit advantageously uses the inputs previously described to avoid delays in generating the run-length control signal.

In functional block 624, data from the first and second output encoders are provided to an output data bus in a second bitwidth format that, in the illustrated embodiment, is wider than the first bitwidth format.

Although the embodiments of the present invention apply to 8B/10B encoding, the encoding can be between other bitwidths (e.g., XB/YB), so long as appropriate modifications are made to the circuitry for handling less or more bits. Further, specific mention is made with regard to "high speed," but the speed of the circuitry should not restrict the invention or applicability to other circuit and semiconductor design implementations. Still further, mention is made to DC-balanced, partitioned-block, high-speed, 8B/10B encoders, but these should only be viewed as examples that will benefit from the features of the claimed invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An encoder, comprising:
classification circuitry for receiving data in a first bitwidth, an output of the classification circuitry being in communication with a disparity control circuit; and
encoding circuitry for encoding the data received in the first bitwidth into a second bitwidth, the encoding circuitry including a special character circuit configured to receive as input signals selected output signals from the encoding circuitry and an output signal from the disparity control circuit, the special character circuit being configured to output a special character signal to be used, along with a logical combination of selected input signals of the first bitwidth, as input signals to a run-length control circuit, which, when triggered, outputs a run-length control signal to reduce run-length of the second bitwidth.

2. An encoder as recited in claim 1, wherein the run-length control circuit is configured to be triggered when the selected input signals of the first bitwidth comprise a predetermined sequence of contiguous data signals.

3. An encoder as recited in claim 2, wherein the predetermined sequence of contiguous data signals is three.

4. An encoder as recited in claim 3, wherein the three contiguous data signals are of the same logic state.

5. An encoder as recited in claim 4, wherein the logic state is one.

6. An encoder as recited in claim 1, wherein the encoding circuitry includes a first output encoder and a second output encoder, the second output encoder including the special character circuit and the run-length control circuit.

7. An encoder as recited in claim 1, wherein the output signal from the disparity control circuit is from a previous encoding cycle.

8. A high-speed encoding system for accepting data in a first bitwidth and generating data in a second bitwidth, comprising:
an input data bus that defines the first bitwidth;
a first classification circuit configured to receive a first portion of the first bitwidth and produce a first bit signal and a first input data set;

a second classification circuit configured to receive a second portion of the first bitwidth and produce a second bit signal and a second input data set;

a disparity control circuit configured to receive the first bit signal from the first classification circuit and the second bit signal from the second classification circuit, wherein the disparity control circuit produces a plurality of disparity output signals;

a first output encoder configured to receive the first input data set from the first classification circuit and to produce a first output data set;

a second output encoder, including a run-length control circuit configured to receive a disparity output signal from the disparity control circuit, a portion of the first output data set from the first output encoder, and a logical combination of the second input data set, wherein the run-length control circuit is selectively triggered to output a run-length control signal based on the sequence of the second input data set, the second output encoder being configured to use the run-length control signal, when the control circuit is triggered, to execute encoding to produce a second output data set having a reduced run-length and to execute encoding in accordance with normal encoding protocol when the control circuit is not triggered to produce the second output data set;

an output data bus combines the first output data set and the second output data set to form the second bitwidth.

9. A high-speed encoding system as recited in claim 8, wherein the processing speed of the first and second encoders are between about 200 MHz and about 275 MHz.

10. A method for encoding data received in a first bitwidth into data of a second bitwidth, comprising:

receiving data in the first bitwidth;

classifying the received data and performing disparity control on the classified data;

encoding a first portion of the received data to produce a first output data set;

executing a special character function during the encoding of a second portion of the received data, the execution of the special character function being performed using a portion of the first output data set and a disparity signal to generate a special character signal;

applying the special character signal and a logical combination of the second portion of the received data to selectively generate a run-length control signal, which, when generated, is used to encode a second portion of the received data such that the run-length of the second bitwidth is reduced; and outputting the data in the second bitwidth.

11. A method for encoding data as recited in claim 10, wherein the second portion of the received data is a predetermined sequence of data signals.

12. A method for encoding data as recited in claim 11, wherein the data signals in the predetermined sequence are of the same logic state.

13. A method for encoding data as recited in claim 12, wherein the logic state is one.

14. A method for encoding data as recited in claim 10, wherein the disparity signal is from a previous encoding cycle.

* * * * *